(12) United States Patent
Krimmer

(10) Patent No.: US 8,933,552 B2
(45) Date of Patent: Jan. 13, 2015

(54) SEMICONDUCTOR PACKAGE

(75) Inventor: Gerald Krimmer, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 307 days.

(21) Appl. No.: 13/312,636

(22) Filed: Dec. 6, 2011

(65) Prior Publication Data

US 2012/0161306 A1 Jun. 28, 2012

Related U.S. Application Data

(60) Provisional application No. 61/427,452, filed on Dec. 27, 2010.

(30) Foreign Application Priority Data

Dec. 23, 2010 (DE) .......................... 10 2010 055 557

(51) Int. Cl.
| | |
|---|---|
| H01L 29/72 | (2006.01) |
| H01L 23/31 | (2006.01) |
| H01L 23/16 | (2006.01) |
| H01L 23/495 | (2006.01) |
| H01L 23/00 | (2006.01) |

(52) U.S. Cl.
CPC ............ *H01L 23/3107* (2013.01); *H01L 23/16* (2013.01); *H01L 23/49541* (2013.01); *H01L 23/562* (2013.01); *H01L 2224/32245* (2013.01); *H01L 2224/48247* (2013.01); *H01L 2224/73265* (2013.01)
USPC ..................................... 257/690; 257/E23.01

(58) Field of Classification Search
CPC ............................................ H01L 2924/01079
USPC ............................................. 257/690, E23.01
See application file for complete search history.

(56) References Cited

U.S. PATENT DOCUMENTS

| | | | | |
|---|---|---|---|---|
| 5,241,133 A | * | 8/1993 | Mullen et al. .................. | 174/534 |
| 6,020,219 A | * | 2/2000 | Dudderar et al. ............. | 438/118 |

OTHER PUBLICATIONS

Chen, Tung-Sheng, "Evaluation of MOS Devices as Mechanical Stress Sensors," *IEEE Transactions on Compounds and Packaging Technologies*, vol. 25. No. 3, 2002.
B. Abesingha et al., Voltage Shift in Plastic-Packaged Bandgap References, *IEEE Transactions on Circuits and Systems II: Analog and Digital Signal Processing*, vol. 49. No. 10 (2002).

\* cited by examiner

*Primary Examiner* — Edward Wojciechowicz
(74) *Attorney, Agent, or Firm* — Fish & Richardson P.C.

(57) ABSTRACT

In one embodiment, a semiconductor package comprising a metal base coupled to one or more pins, a semiconductor body having a top side and a bottom side, the top side comprising an integrated circuit and one or more metal surfaces for coupling the integrated circuit to the one more pins with one or more bonding wires, the bottom side non-positively coupled to the metal base, a disk having a top area and a base area, the base area coupled to the top side of the semiconductor body and at least partially covering the integrated circuit, the disk being electrically insulated from the semiconductor body, and a plastic compound completely enclosing the one or more bonding wires, and at least partially enclosing the top side of the integrated circuit, the top area of the disk, and the one or more pins.

19 Claims, 2 Drawing Sheets

SEMICONDUCTOR PACKAGE

RELATED APPLICATIONS

This application claims the benefit, under 35 U.S.C. §119 (e), of U.S. Provisional Patent Application No. 61/427,452, entitled "Semiconductor Package," filed 27 Dec. 2010. This application also claims the benefit, under 35 U.S.C. §119(a), of German Patent Application No. 102010055557.6-33, entitled "Halbleitergehäuse," filed 23 Dec. 2010.

TECHNICAL FIELD

This disclosure relates to semiconductor packages.

BACKGROUND

A semiconductor package is a casing containing one or more semiconductor electronic components.

DESCRIPTION OF EXAMPLE EMBODIMENTS

Figure 1:
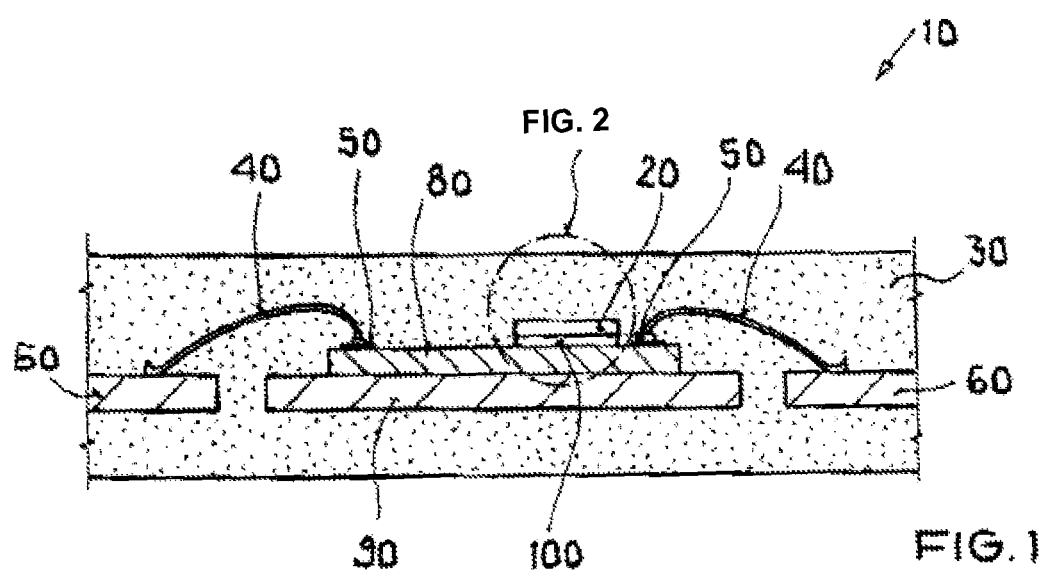
FIG. 1 shows a schematic cross-section of an example embodiment of a semiconductor package.

A semiconductor package with a semiconductor body is described in the printed publication Tung-Sheng Chen, *Evaluation of MOS Devices as Mechanical Stress Sensors*, IEEE TRANSACTIONS ON COMPOUNDS AND PACKAGING TECHNOLOGIES, Vol. 25. No. 3 (2002). The semiconductor package is essentially formed from a plastic compound, hereinafter also termed molding compound. In another printed publication, an analysis of the influence of stress from the molding compound on the electrical parameters of a bandgap circuit is described. B. Abesingha et al., *Voltage Shift in Plastic-Packaged Bandgap References*, IEEE TRANSACTIONS ON CIRCUITS AND SYSTEMS II: ANALOG AND DIGITAL SIGNAL PROCESSING, Vol. 49. No. 10 (2002).

In particular embodiments, a semiconductor package is disclosed. Particular embodiments of the semiconductor package comprise a metal base with several pins and a semiconductor body located on the metal base with a top face and a bottom face. The bottom face is connected with the metal base as a non-positive joint. The semiconductor body has an integrated circuit and a plurality of metal surfaces on the top face, and the metal surfaces are connected with the pins by means of bonding wires. A molding compound is formed, wherein the molding compound encloses the bonding wires completely and the semiconductor body at least partially on the top face as well as the pins. On the top face of the semiconductor body, a disk with a base area and a top area is arranged and the disk with the base area partially covers the integrated circuit on the top face of the semiconductor. The top area of the disk is enclosed with molding compound and the disk is electrically insulated from the semiconductor body and the pins, wherein the flexural rigidity of the disk exceeds the flexural rigidity of the surrounding molding compound in order to distribute the compressive stress point load on the top area of the disk across the surface of the semiconductor body.

Particular embodiments of the disk protect a particularly pressure-sensitive, integrated circuit on the top face of the semiconductor body against excessive point loads that may be caused by, for example, the filler in the molding compound. Particular embodiments of the disk reliably suppresses undesirable point loads and shear forces, in particular, during the casting of the semiconductor body with a plastic compound for producing the semiconductor package. The casting process is also called molding. Compressive stresses and the influence of shear forces may result in undesirable interference with electrical parameters in sensitive areas of integrated circuits. In particular embodiments, the disk may also suppress undesirable changes of electrical parameters due to temperature stress during the molding process.

In particular embodiments, the disk may act as a buffer and absorb part of the molding heat. In particular embodiments, by means of a cover plate, the electrical parameters, also called "matching" structures, may have a substantially lower shift offset. Altogether, this may result in a significant increase of the yield during the production of the packaged semiconductors. In particular embodiments, the disk may permanently reduce the sensitivity with respect to pressure, temperature, and the influence of shear forces even after molding. In particular embodiments, the drift of component parameters due to environmental influences, such as solder stress, fluctuations in temperature, and aging, may also be reduced.

In particular embodiments, the casting compound may cover the side face of the semiconductor body at least partially, during the molding process. In particular embodiments, the casting compound may also cover the side face of the semiconductor body completely during the molding process.

In particular embodiments, an adhesive layer may formed on the base area of the disk as a support layer with double-sided adhesive characteristics. The disk may be secured against slippage in the further process steps, by means of the adhesive layer, which may have a minimum thickness of 50 µm and is formed on the base area of the disk. A reliable sealing surface between the base area of the disk and the semiconductor surface may be formed during the formation of the semiconductor package, i.e. during the molding process. If an elastic adhesive layer is used, the compressive forces acting localized as well as across the semiconductor surface, may be reduced, and the undesirable interference with the electrical parameters of the of the components of the integrated circuit arranged below the disk of the underlying semiconductor surface may be suppressed. Particular embodiments may electrically isolate the disk completely.

In particular embodiments, the disk may be formed completely from a homogenous material. In particular embodiments, the material characteristics of the disks, such as the coefficient of expansion of the disk is comparable to the coefficient of expansion of the semiconductor body. In particular embodiments, for example, the coefficient of expansion of the disk may be a maximum of 30% greater or less than the coefficient of expansion of the semiconductor body, or may be equivalent to the coefficient of expansion of the semiconductor body. In particular embodiments, in order to achieve a coefficient of expansion of the disk and the semiconductor body that is at least approximately equal, the material of the disk may correspond to that of the semiconductor body. In particular embodiments, if the semiconductor body is formed from silicon, silicon may be used as the material for the disk. In particular embodiments, the influence of stress on the integrated circuit formed below the base area of the disk may be reduced significantly.

In particular embodiments, the disk may have a thickness of at least 50 μm and 200 μm maximum. In particular embodiments, for example, traditional wafer material may be used as a material for the disk and the wafer may be thinned to the desired thickness by means of a standard process. In particular embodiments, by covering only such surface areas of the semiconductor body that have particularly sensitive locations by means of the disk, a plurality of disk sections for cover may be formed from one wafer. In particular embodiments, only a few process steps, such as a sawing process and a singulation process, may be required for producing the disk sections. This makes the many costs-intensive process steps for the manufacture of components obsolete.

In particular embodiments, a wafer with a completely developed integrated circuit may be singulated in a process step, and the singulated semiconductor body, also termed die, and which has a top face and a bottom face, may be attached with its bottom face onto a metal base. The integrated circuit may be electrically connected by means of metal surfaces, also called pads, with pins in a subsequent bonding process via bonding wires. In particular embodiments, a disk, comprising a base area and a top area may be arranged and fixed with the base area on the integrated circuit on the surface of the semiconductor body. In a subsequent molding process, a plastic compound, also called casting compound, may be injected and cured, so that the bonding wires in the top area of the disk are enclosed completely and the pins and the semiconductor body on the surface and side faces may be partially enclosed by the plastic compound.

In particular embodiments, disks for covering an integrated circuit for protection against stress influence may be manufactured reliably and cost-effectively. In particular embodiments, the thickness of the disk may be adjusted simply and cost-effectively by thinning, and in this way, the thickness of the semiconductor body may be made greater than the thickness of the disk. In particular embodiments, the die may be highly stabile during the molding process. In particular embodiments, the overall height of the semiconductor package may be kept below 1 mm.

FIG. 1 shows an example embodiment of a semiconductor package 10, with a disk 20, with a plastic compound 30, with bonding wires 40, which connect the metal surfaces 50 electrically with pins 60, to enclose it. The plastic compound 30, also called a molding compound, encloses a part of a surface of a semiconductor body 80. The semiconductor body 80 is located on a metal base 90 and is connected with a metal base 90 as a non-positive joint. The metal surfaces 50 are connected with an integrated circuit (not shown) on the top face of the semiconductor body 80. In particular embodiments, the plastic compound 30 may completely cover the surface of the disk 20, as shown in FIG. 1. An adhesive layer 100 may be formed on the base area of the disk 20. Although the illustrated package shows an example standard type of package, other types of packages, such as quad-flat no-leads (QFN) packages may be used.

Figure 2:
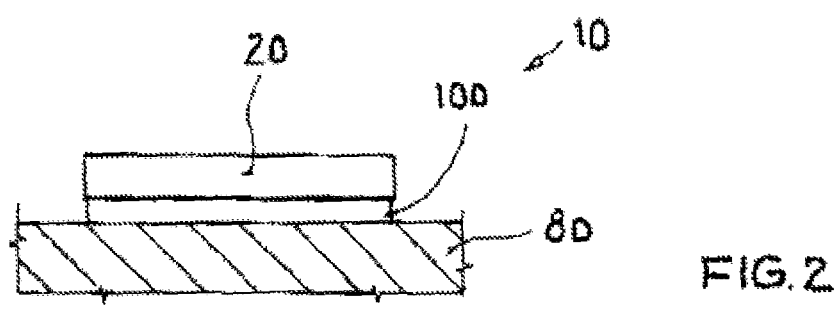
FIG. 2 shows an enlarged section of an area where an example disk is lying on the top face of the example semiconductor body.

FIG. 2 shows an enlarged section of FIG. 1 in the area where the disk 20 is lying on top of semiconductor body 80. FIG. 2 shows an example embodiment showing that an adhesive layer 100 is formed on the entire surface below the disk 20. Although the adhesive layer 100 shown in FIG. 2 covers the base area of the disk 20 completely, in particular embodiments, an adhesive layer may be formed only on a part of the base area of the disk 20. In particular embodiments, an adhesive strip may be formed along the perimeter edges of the disk 20 to prevent the penetration of molding compound during the molding process.

Figure 3:
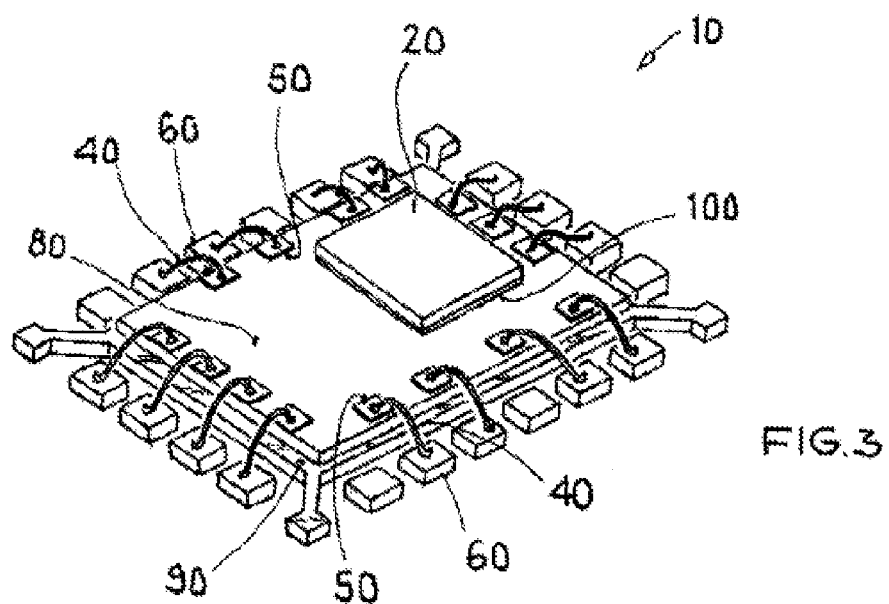
FIG. 3 shows a perspective view of an example disk lying on top of an example semiconductor body in an un-molded condition.

FIG. 3 shows a perspective view of an example semiconductor body 80 with the disk 20 lying on top after the disk has been mounted, prior to performing the molding process. It should be noted, that the disk 20 covers only a partial area of the surface of the semiconductor body 80. Any components of the integrated circuit that are particularly sensitive to stress may be located below disk 20. In particular embodiments, multiple disk sections may be arranged on the surface of the semiconductor body 80.

Figure 4:
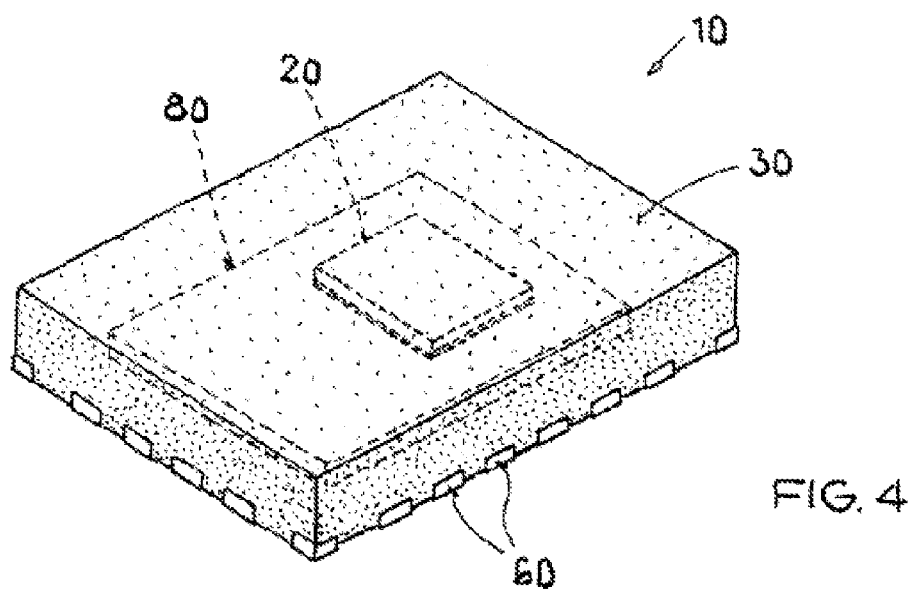
FIG. 4 shows a perspective view of an example semiconductor package in a cast condition as a quad-flat no-leads (QFN) package.

In the example embodiment shown FIG. 4, an example semiconductor package 10 designed as a QFN package, is shown as a perspective view following singulation. The ends of the pins 60 may be seen on the bottom face of the semiconductor package 10.

The example embodiments shown in the Figures are mainly schematic, i.e. the distances and the lateral and vertical dimensional ranges may not be to scale and also may not have any derivable geometrical relation to each other unless stated otherwise.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The present disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A semiconductor package comprising:
   a metal base;
   one or more pins;
   a semiconductor body having a top side and a bottom side, the top side comprising an integrated circuit and one or more metal surfaces for coupling the integrated circuit to the one more pins with one or more bonding wires, the bottom side non-positively coupled to the metal base;
   a disk having a top area and a base area, the base area coupled to the top side of the semiconductor body and at least partially covering the integrated circuit, the disk being electrically insulated from the semiconductor body; and
   a plastic compound completely enclosing the one or more bonding wires, and at least partially enclosing the top side of the integrated circuit, the top area of the disk, and the one or more pins.

2. The semiconductor package of claim 1, wherein the disk distributes a compressive stress point load on the top area of the disk across the top side of the semiconductor body.

3. The semiconductor package of claim 1, wherein the disk comprises a homogeneous material.

4. The semiconductor package of claim 1, wherein the disk comprises silicon.

5. The semiconductor package of claim 1, wherein the disk comprises a thickness of 50 μm to 200 μm.

6. The semiconductor package of claim 1, wherein the disk is completely electrically insulated.

7. The semiconductor package of claim 1, wherein the disk comprises a flexural rigidity that is greater than the plastic compound.

8. The semiconductor package of claim 1, wherein the disk has a first coefficient of expansion that is substantially the same as a second coefficient of expansion of the semiconductor body.

9. The semiconductor package of claim 1, wherein the base area of the disk is coupled to the top side of the semiconductor body by an adhesive layer.

10. The semiconductor package of claim 9, wherein the adhesive layer is at least 30 μm thick.

11. The semiconductor package of claim 1, wherein the adhesive layer has a base film.

12. A semiconductor package comprising:
a metal base;
one or more pins;
a semiconductor body having a top side and a bottom side, the top side comprising an integrated circuit and one or more metal surfaces for coupling the integrated circuit to the one more pins with one or more bonding wires, the bottom side non-positively coupled to the metal base;
a disk comprising a homogeneous material having a top area and a base area, the base area coupled to a sensitive location of the top side of the semiconductor body and at least partially covering the integrated circuit, the disk being electrically insulated from the semiconductor body and distributing a compressive stress point load on the top area of the disk across the top side of the semiconductor body; and
a plastic compound having a flexural rigidity less than the disk, the plastic compound completely enclosing the one or more bonding wires, and at least partially enclosing the top side of the integrated circuit, the top area of the disk, and the one or more pins.

13. The semiconductor package of claim 12, wherein the disk comprises silicon.

14. The semiconductor package of claim 12, wherein the disk comprises a thickness of 50 μm to 200 μm.

15. The semiconductor package of claim 12, wherein the base area of the disk is coupled to the top side of the semiconductor body by an adhesive layer.

16. The semiconductor package of claim 15, wherein the adhesive layer is at least 30 μm thick.

17. A semiconductor package comprising:
a metal base;
one or more pins;
a semiconductor body having a top side and a bottom side, the top side comprising an integrated circuit and one or more metal surfaces for coupling the integrated circuit to the one more pins with one or more bonding wires, the bottom side coupled to the metal base;
a disk having a top area and a base area, the base area coupled to the top side of the semiconductor body and at least partially covering the integrated circuit, wherein the disk is electrically insulated from the semiconductor body and distributes a compressive stress point load on the top area of the disk across the top side of the semiconductor body; and
a plastic compound completely enclosing the one or more bonding wires, and at least partially enclosing the top side of the integrated circuit, the top area of the disk, and the one or more pins.

18. The semiconductor package of claim 17, wherein the disk comprises a homogeneous material and has a thickness of 50 μm to 200 μm.

19. The semiconductor package of claim 17, wherein the base area of the disk is coupled to the top side of the semiconductor body by an adhesive layer that is at least 30 μm thick.

* * * * *

UNITED STATES PATENT AND TRADEMARK OFFICE
CERTIFICATE OF CORRECTION

PATENT NO. : 8,933,552 B2
APPLICATION NO. : 13/312636
DATED : January 13, 2015
INVENTOR(S) : Gerald Krimmer It is certified that error appears in the above-identified patent and that said Letters Patent is hereby corrected as shown below:

Title page, item (57), col. 2, line 5, delete "one more pins" and insert -- one or more pins --, therefor.

In the Specification,

Col. 2, line 49, delete "of the of the" and insert -- of the --, therefor.

In the Claims,

Col. 4, line 52, Claim 1, delete "one more pins" and insert -- one or more pins --, therefor.

Col. 5, line 27, Claim 12, delete "one more pins" and insert -- one or more pins --, therefor.

Col. 6, line 19, Claim 17, delete "one more pins" and insert -- one or more pins --, therefor.

Signed and Sealed this
Twelfth Day of May, 2015

Michelle K. Lee
*Director of the United States Patent and Trademark Office*